(12) United States Patent
Choksi et al.

(10) Patent No.: US 7,015,683 B1
(45) Date of Patent: Mar. 21, 2006

(54) JFET SWITCH SELECT CIRCUIT

(75) Inventors: Ojas M. Choksi, Monmouth Junction, NJ (US); Bindu Gupta, Monmouth Junction, NJ (US); Faramarz Sabouri, Lawrenceville, NJ (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/969,622

(22) Filed: Oct. 20, 2004

(51) Int. Cl.
*G05F 3/16* (2006.01)

(52) U.S. Cl. ...................................... 323/313; 323/314
(58) Field of Classification Search ................ 323/313, 323/314, 315
See application file for complete search history.

(56) References Cited

U.S. PATENT DOCUMENTS

| | | | |
|---|---|---|---|
| 3,916,222 A | 10/1975 | Compton | 307/251 |
| 4,016,595 A | 4/1977 | Compton | 307/43 |
| 4,042,836 A | 8/1977 | Compton et al. | 307/251 |
| 4,103,186 A | 7/1978 | Albarran et al. | 307/251 |
| 4,228,367 A | 10/1980 | Brown | 307/251 |
| 4,367,419 A | 1/1983 | Yazawa et al. | 307/254 |
| 5,053,653 A | 10/1991 | Bowers et al. | 307/581 |
| 5,055,723 A | 10/1991 | Bowers et al. | 307/581 |
| 5,091,657 A | 2/1992 | Burt | 307/246 |
| 5,229,733 A * | 7/1993 | Boezen et al. | 330/298 |
| 5,327,098 A | 7/1994 | Molina et al. | 330/254 |
| 5,523,709 A * | 6/1996 | Phillips et al. | 327/143 |
| 5,754,078 A * | 5/1998 | Tamagawa | 330/255 |
| 6,091,226 A * | 7/2000 | Amano | 320/116 |
| 6,529,078 B1 * | 3/2003 | Gosser et al. | 330/255 |
| 6,885,224 B1 * | 4/2005 | Hastings | 327/78 |

* cited by examiner

*Primary Examiner*—Bao Q. Vu
(74) *Attorney, Agent, or Firm*—Iandiorio & Teska

(57) ABSTRACT

A JFET switch select circuit including a first current mirror system including a first high current mirror circuit referenced to high rail voltage and a first low current mirror circuit referenced to a low rail voltage, a second current mirror system including a second high current mirror circuit referenced to the high rail voltage and a second low current mirror circuit referenced to the low rail voltage, and a comparator circuit responsive to an input voltage and a reference voltage for directing current from a current supply circuit to one of the first and second high current mirror circuits and one of the first and second low current mirror circuits for saturating a switching device of one of the first and second high current mirror circuits to set a first output voltage proximate to a high rail voltage and for saturating a switching device of one of the first and second low current mirror circuits to set a second output voltage proximate a low rail voltage.

28 Claims, 4 Drawing Sheets

JFET SWITCH SELECT CIRCUIT

FIELD OF THE INVENTION

This invention relates to an improved JFET switch select circuit.

BACKGROUND OF THE INVENTION

Junction field effect transistor (JFET) switch select circuits are useful in many switching applications, such as programmable gain amplifiers (PGA), analog switches and the like. Typical prior art JFET switch select circuits rely on high speed turning on and turning off of a JFET switch that produces large quiescent current flow during the on and off states which increases power consumption. Although prior art switch select switches may have high speed switching capabilities, the design of a typical prior art switch select circuit includes an extensive number of devices, including large resistors and capacitors, and the like, which results in a complex design that utilizes a large amount of die area and increased power dissipation. The increased number of devices are also prone to temperature variations and performance variations due to inconsistencies in the manufacturing process. Moreover, conventional JFET switch select circuits typically include current circuits which draw substantial static current from the power sources.

BRIEF SUMMARY OF THE INVENTION

It is therefore an object of this invention to provide an improved JFET switch select circuit.

It is a further object of this invention to provide such an improved JFET switch select circuit which reduces quiescent current flow.

It is a further object of this invention to provide such an improved JFET switch select circuit which provides one output voltage virtually equal to a high rail voltage.

It is a further object of this invention to provide such an improved JFET switch select circuit which provides a second output voltage virtually equal to a low rail voltage.

It is a further object of this invention to provide such an improved JFET switch select circuit which is simple in design.

It is a further object of this invention to provide such an improved JFET switch select circuit which utilizes less power.

It is a further object of this invention to provide such an improved JFET switch select circuit which utilizes less die area.

It is a further object of this invention to provide such an improved JFET switch select circuit which reduces static current drawn from the power sources.

It is a further object of this invention to provide such an improved JFET switch select circuit which eliminates the need to use large resistors or capacitors.

It is a further object of this invention to provide such an improved JFET switch select circuit which utilizes a small number of devices.

It is a further object of this invention to provide such an improved JFET switch select circuit which reduces errors associated with large temperature variations generated by a large number of devices.

It is a further object of this invention to provide such an improved JFET switch select circuit with increased reliability.

It is a further object of this invention to provide such an improved JFET switch select circuit which guarantees a reliable operation with programmable high and low rail voltages.

This invention results from the realization that an innovative JFET switch select circuit can be achieved by saturating a transistor of one of first and second high current mirror circuits referenced to a high rail voltage to set a first voltage output virtually equal to the high rail voltage and saturating a transistor of one of first and second low mirror circuits referenced to a low rail voltage to set a second voltage output virtually equal to the low rail voltage.

This invention features a JFET switch select circuit including a first current mirror system including a first high current mirror circuit referenced to a high rail voltage and a first low current mirror circuit referenced to a low rail voltage, a second current mirror system including a second high current mirror circuit referenced to the high rail voltage and a second low current mirror circuit referenced to the low rail voltage, and a comparator circuit responsive to an input voltage and a reference voltage for directing current from a current supply circuit to one of the first and second high current mirror circuits and one of the first and second low current mirror circuits for saturating a switching device of one of the first and second high current mirror circuits to set a first output voltage proximate to a high rail voltage and for saturating a switching device of one of the first and second low current mirror circuits to set a second output voltage proximate a low rail voltage.

In one embodiment, the first high current mirror circuit and the first low current mirror circuit each may include a controlling and controlled transistor. The controlled transistor of the first high current mirror circuit may be saturated when the input voltage is greater than the reference voltage by providing current to the controlled transistor of the first high current mirror circuit while no current is supplied the controlled transistor of the first low current mirror circuit. The controlled transistor of the first low current mirror circuit may be saturated when the input voltage is less than the reference voltage by providing current to the controlled transistor of the first low current mirror circuit while no current is supplied to the controlled transistor of the first high current mirror circuit. The second high current mirror circuit and the second low current mirror circuit each may include a controlling and controlled transistor. The controlled transistor of the second low current mirror circuit may be saturated when the input voltage is greater than the reference voltage by providing current to the controlled transistor of the second low current mirror circuit while no current is supplied to the controlled transistor of the second high current mirror circuit. The controlled transistor of the second high current mirror circuit may be saturated when the input voltage is less than the reference voltage by providing current to the controlled transistor of the second high current mirror circuit while no current is supplied to the controlled transistor of the second low current mirror circuit. The comparator circuit may include a first differential circuit for directing the current from the current circuit to one of the first and second the high current mirror circuits. The first differential circuit may include a first differential pair of transistors. The comparator circuit may further include a second differential circuit responsive to the first differential circuit for directing the current from the current circuit to one of the first and second low current mirror circuits. The second differential circuit may include a second differential pair of transistors. The first differential pair of transistors may be of opposite polarity to the second differential pair of transistors. The JFET switch select circuit may further include a resistor interconnected between the inputs of each of the first and second high current mirror circuits and the first differential circuit for setting a predetermined voltage differential at the second differential circuit. The current circuit may include first and second current sources, the first current source supplying current to one of the first and second high current mirror circuits and the second current source supplying current to one of the first and second low current mirror circuits. The current circuit may further include a third current source interconnected to the high rail voltage power supply and matched to the first current source for supplying current to the first and second high current mirror circuits to reduce the current sunk from the high rail voltage supply by the first current source. The current circuit may further include a fourth current supply connected to a low rail voltage power supply and matched to the second current source for supplying to the first and second low current mirror circuits to reduce the current sourced to the low rail voltage power supply by the second current source. The first and second output voltages may enable gates of first and second junction field effect transistors of a programmable gain amplifier to selectively switch the junction field effect transistors on and off. The first and second output voltages may enable a gate of a junction field effect transistors of an analog switch circuit to selectively switch the gate on and off. The JFET switch select circuit may further include a resistor interconnected between the outputs of each of the first and second low current mirror circuits and the second differential circuit for setting a predetermined voltage at the first differential circuit. The input voltage and the reference voltage may be applied to the second differential circuit for directing the current from the current supply circuit to the one of first and second low current mirror circuits for saturating the switching device of one of the first and second high current mirror circuits to set a first output voltage proximate to a high rail voltage and for saturating a transistor of one of the first and second low current mirror circuits to set a second output voltage proximate to a low rail voltage.

This invention further features a JFET switch select circuit including a first current mirror system including a first high current mirror circuit referenced to a high rail voltage and a first low current mirror circuit referenced to a low rail voltage, a second current mirror system including a second high current mirror circuit referenced to the high rail voltage and a second low current mirror circuit referenced to the low rail voltage, a comparator circuit responsive to an input voltage and a reference voltage for directing current from a current circuit to one of the first and second high current mirror circuits and one of the first and second low current mirror circuits for saturating a switching device of one of the first and second high current mirror circuits to set a first output voltage proximate to the high rail voltage and for saturating a switching device of one of the first and second low current mirror circuits to set a second voltage output proximate to the low rail voltage, and a programmable gain amplifier including first and second junction field effect transistors responsive to the first and second output voltages that selectively switch the first and second junction field effect transistors on and off.

This invention also features a JFET switch select circuit including a first current mirror system including a first high current mirror circuit referenced to a high rail voltage and a first low current mirror circuit referenced to a low rail voltage, a second current mirror system including a second high current mirror circuit referenced to the high rail voltage and a second low current mirror circuit referenced to the low rail voltage, a comparator circuit responsive to an input voltage and a reference voltage for directing current from a current circuit to one of the first and second high current mirror circuits and one of the first and second low current mirror circuits for saturating a switching device of one of the first and second high current mirror circuits to set a first output voltage proximate to the high rail voltage and for saturating a switching device of one of the first and second low current mirror circuits to set a second voltage output proximate to the low rail voltage, and an analog switch circuit including at least one gate response to the first voltage and the high rail voltage that selectively switch the field effect transistor on and off.

This invention also features a JFET switch select circuit including a first current mirror system including a first high current mirror circuit referenced to a high rail voltage and a first low current mirror circuit referenced to a low rail voltage each having a controlling and controlled transistor, a second current mirror system including a second high current mirror circuit referenced to the high rail voltage and a second low current mirror circuit referenced to the low rail voltage each having a controlling and controlled transistor, and a comparator circuit responsive to an input voltage and a reference voltage for directing current from a current supply circuit to one of the first and second high current mirror circuits and one of the first and second low current mirror circuits for saturating the controlled transistor of one of the first and second high current mirror circuits to set a first output voltage proximate to a high rail voltage and for saturating the controlled transistor of one of the first and second low current mirror circuits to set a second output voltage proximate a low rail voltage.

This invention further features a JFET switch select circuit including a first current mirror system including a first high current mirror circuit referenced to a high rail voltage and a first low current mirror circuit referenced to a low rail voltage each having a controlling and controlled transistor, a second current mirror system including a second high current mirror circuit referenced to the high rail voltage and a second low current mirror circuit referenced to the low rail voltage each having a controlling and controlled transistor, and a comparator circuit responsive to an input voltage and a reference voltage for directing current from a current supply circuit to the controlling transistor of the first high current mirror circuit and the controlling transistor of the second low current mirror circuit for saturating the controlled transistor of the first high current mirror circuit to set a first output voltage proximate to a high rail voltage and for saturating the controlled transistor of the second low current mirror circuit to set a second output voltage proximate a low rail voltage.

In one embodiment, the input voltage may be lesser than the reference voltage. The comparator circuit may be responsive to the input reference voltage being greater than the input voltage and directs current from a current supply circuit to the controlling transistors of the second high current mirror circuit and the controlling transistor of the first low current mirror circuit for saturating the controlled transistor of one of the second high current mirror circuit to set a second output voltage proximate to a high rail voltage and for saturating the controlled transistor of the first low current mirror circuit to set a first output voltage proximate a low rail voltage.

This invention further features an N-type JFET switch select circuit including a first current mirror system including a first high current mirror circuit referenced to a high rail voltage and a first low current mirror circuit referenced to a low rail voltage, a second current mirror system including a second high current mirror circuit referenced to the high rail voltage and a second low current mirror circuit referenced to the low rail voltage, and a comparator circuit responsive to an input voltage and a reference voltage for directing current from a current supply circuit to one of the first and second high current mirror circuits and one of the first and second low current mirror circuits for saturating a switching device of one of the first and second high current mirror circuits to set a first output voltage proximate to a high rail voltage and for saturating a switching device of one of the first and second low current mirror circuits to set a second output voltage proximate a low rail voltage.

This invention also features a P-type JFET switch select circuit including a first current mirror system including a first high current mirror circuit referenced to a high rail voltage and a first low current mirror circuit referenced to a low rail voltage, a second current mirror system including a second high current mirror circuit referenced to the high rail voltage and a second low current mirror circuit referenced to the low rail voltage, and a comparator circuit responsive to an input voltage and a reference voltage for directing current from a current supply circuit to one of the first and second high current mirror circuits and one of the first and second low current mirror circuits for saturating a switching device of one of the first and second high current mirror circuits to set a first output voltage proximate to a high rail voltage and for saturating a switching device of one of the first and second low current mirror circuits to set a second output voltage proximate a low rail voltage.

BRIEF DESCRIPTION OF THE DRAWINGS

Other objects, features and advantages will occur to those skilled in the art from the following description of a preferred embodiment and the accompanying drawings, in which.

PREFERRED EMBODIMENT

Figure 1:
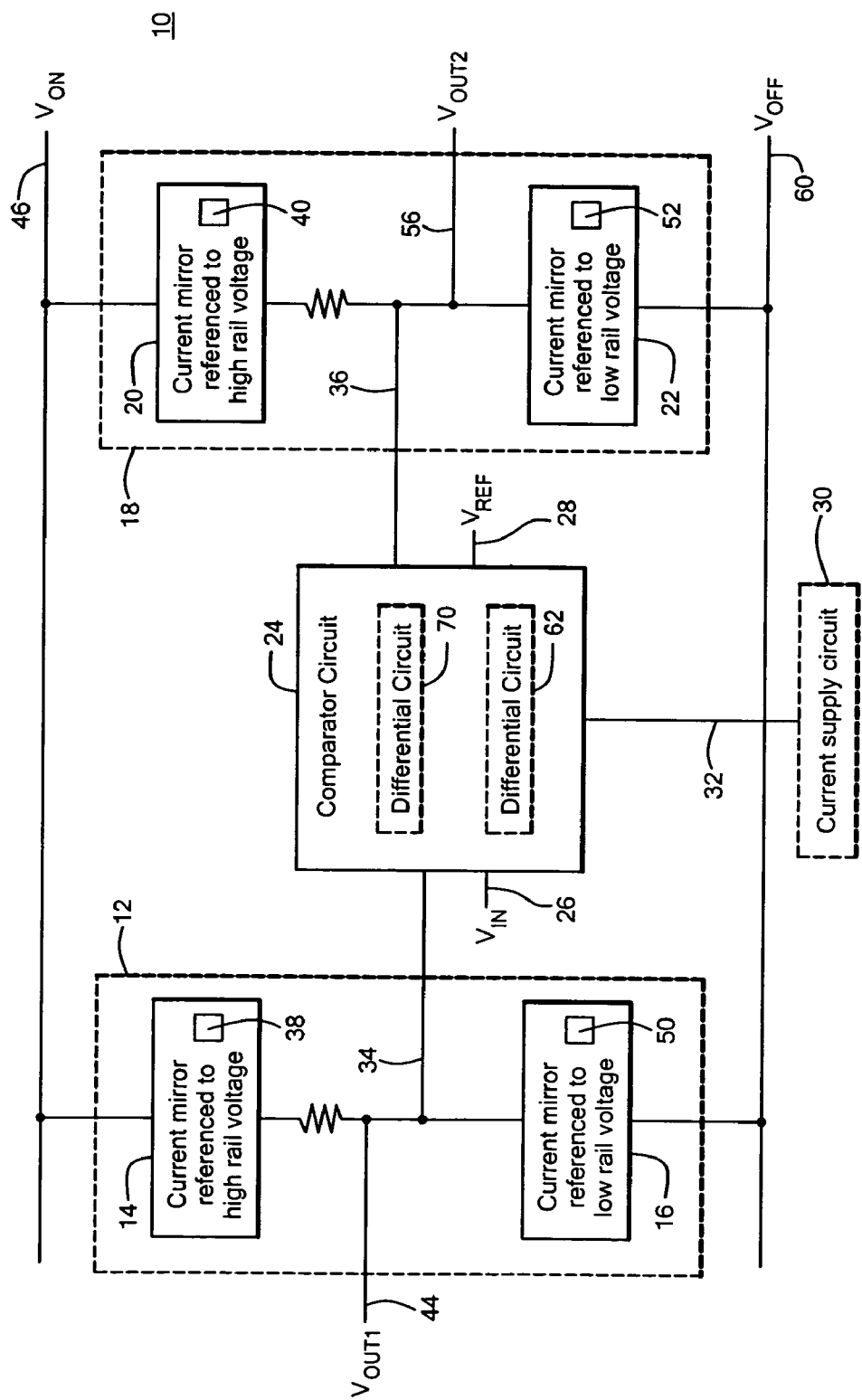
FIG. 1 is a schematic block diagram of the JFET switch select circuit of one embodiment of this invention.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings.

There is shown in FIG. 1 JFET switch select circuit 10 of this invention. JFET switch select circuit 10 includes first current mirror system 12 which includes high current mirror circuit 14 referenced to a high rail voltage 46 and low current mirror circuit 16 referenced to low rail voltage 60. Current mirror system 18 includes high current mirror circuit 20 referenced to high rail voltage 46 and low current mirror circuit 22 referenced to low rail voltage 60. As described herein, "high current mirror circuit" means a current mirror circuit referenced to a high rail voltage and "low current mirror circuit" means a current mirror circuit referenced to a low rail voltage. Comparator circuit 24 compares the input voltage $V_{IN}$ on line 26 to the reference voltage on line 28 and directs current from current supply circuit 30 (discussed in further detail below) on line 32 to either high current mirror circuit 14 referenced to high rail voltage 46 on line 34 or high current mirror circuit 20 referenced to high rail voltage 46 on line 36 depending on the voltage difference of $V_{IN}$ and $V_{REF}$. Differential circuit 62, also discussed in further detail below, compares $V_{IN}$ and $V_{REF}$, and when $V_{IN}$ is greater than $V_{REF}$ directs current to enable high current mirror circuit 14; when $V_{IN}$ is less than $V_{REF}$, differential circuit 62 directs current to enable high current mirror circuit 20. Differential circuit 70, of opposite polarity to differential circuit 62, is responsive to the voltages on line 34 and line 36 and directs current from current supply circuit 30 to low current mirror circuit 16 or 22 referenced to low rail voltage 60 based on whether current mirror circuit 14 or current mirror circuit 20 is enabled. When current mirror circuit 14 is enabled differential circuit 70 directs current from current supply circuit 30 to low current mirror circuit 22. Similarly, when current mirror circuit 20 is enabled differential circuit 70 directs current from current supply circuit 30 to current mirror circuit 16.

Thus, when $V_{IN}$ is greater than $V_{REF}$, differential circuit 62 directs current to enable high current mirror circuit 14. Differential circuit 70 responds to the enabled high current mirror circuit 14 and directs current to enable low current mirror circuit 22. At this point, high current mirror circuit 20 and low current mirror circuit 16 are disabled. Because high current mirror circuit 14 referenced to high rail voltage 46 is enabled and low current mirror circuit 16 referenced to low rail voltage 60 is disabled, the controlled transistor (discussed in detail below) of high current mirror circuit 14, indicated at 38, will saturate and effectively set the voltage $V_{OUT1}$ on line 44 proximate to, e.g., within about 0.1 to 0.2 volts, of the voltage of high rail voltage 46. Similarly, because low current mirror circuit 22 is enabled and high current mirror circuit 20 is disabled, the controlled transistor (also discussed in detail below) of low current mirror circuit 22, indicated at 52, will saturate and effectively set the voltage $V_{OUT2}$ on line 56 proximate to the voltage of low rail voltage 60.

When $V_{IN}$ is less than $V_{REF}$, high current mirror circuit 20 and low current mirror circuit 16 will be enabled while high current mirror circuit 14 and low current mirror circuit 22 are disabled. In this case, the controlled transistor of high current mirror circuit 20 referenced to high rail voltage 46, indicated at 40, will saturate to set $V_{OUT2}$ on line 56 proximate to high rail voltage 46 and the controlled transistor of low current mirror circuit 16 referenced to low rail voltage 60, indicated at 50, will saturate to set $V_{OUT2}$ on line 44 proximate to low rail voltage 60.

Figure 2:
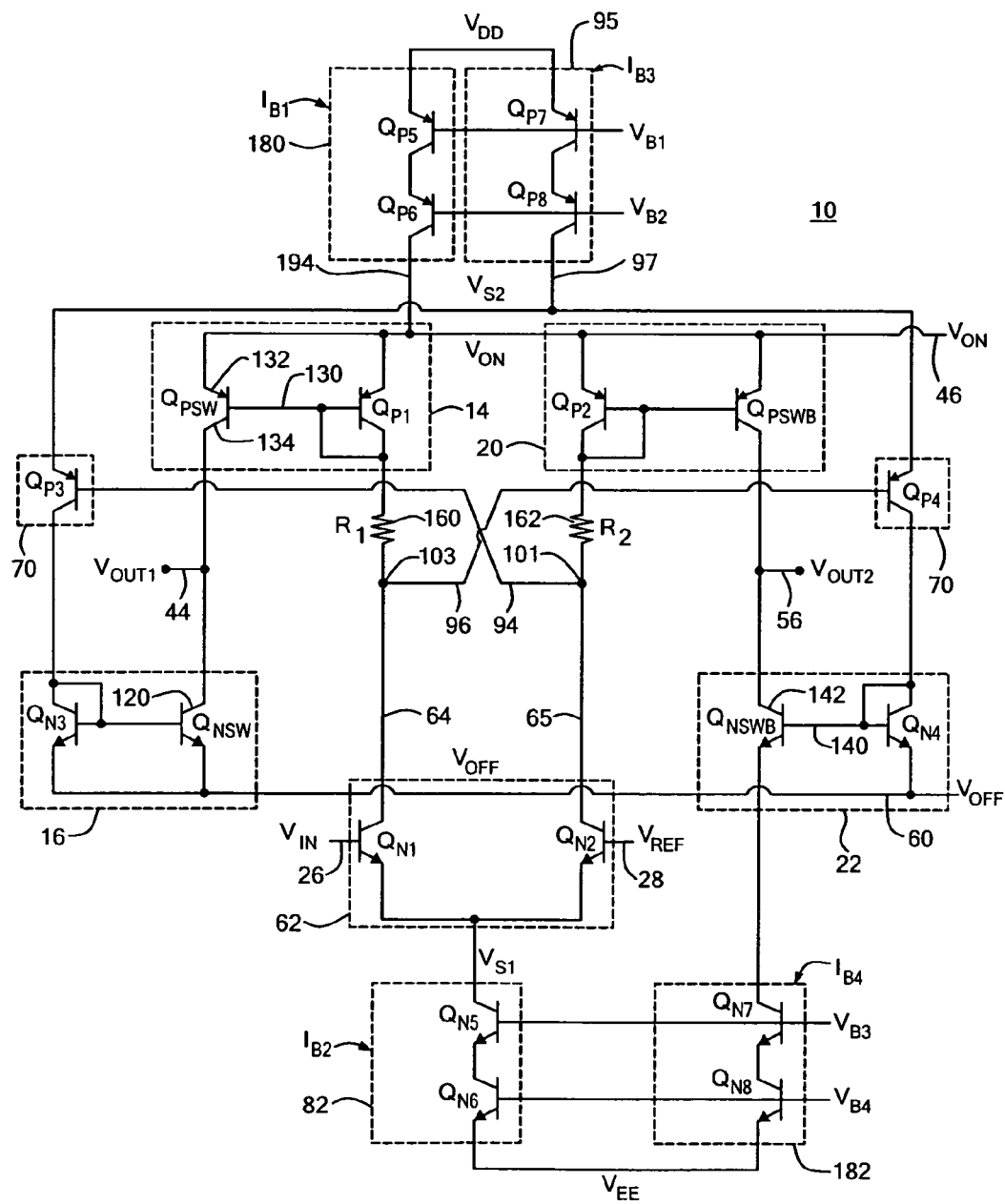
FIG. 2 is a schematic diagram showing in detail the components of the JFET switch select circuit shown in FIG. 1.

As shown in greater detail in FIG. 2, differential circuit 62 may include a differential pair of transistors, such as transistors $Q_{N1}$ and $Q_{N2}$ of the same polarity, e.g., N-type transistors, which are responsive to input voltage $V_{IN}$ on line 26 and reference voltage $V_{REF}$ on line 28, respectively. Differential circuit 62 directs current from current supply circuit 82 to high current mirror circuit 14 on line 64 when $V_{IN}$ is greater than $V_{REF}$ and to high current mirror circuit 20 on line 65 when $V_{IN}$ is less than $V_{REF}$.

High current mirror circuits 14 and 20 and low current mirror circuits 16 and 22 each include at least two switching devices, e.g., transistors, one of which is saturated, as discussed above, to set the voltages at $V_{OUT1}$, and $V_{OUT2}$. High current mirror circuit 14 includes controlling transistor $Q_{P1}$ and a controlled transistor $Q_{PSW}$ and high current mirror circuit 20 includes controlling transistor $Q_{P2}$ and a controlled transistor $Q_{PSWB}$. Low current mirror circuit 16 includes controlling transistor $Q_{N3}$ and controlled transistor $Q_{NSW}$ and low current mirror circuit 22 includes controlling transistor $Q_{N4}$ and a controlled transistor $Q_{NSWB}$.

Differential circuit 70 typically includes a differential pair of transistors, such as transistors $Q_{P3}$ and $QP_4$, of opposite polarity to transistors $Q_{N1}$ and $Q_{N2}$ of differential circuit 62, e.g., P-type transistors. Transistors $Q_{P3}$ and $Q_{P4}$ are responsive to the voltages at the collectors of controlling transistors $Q_{P2}$ and $Q_{P1}$ of high current mirror circuits 20 and 14 at nodes 101 and 103 on lines 94 and 96, respectively. Differential circuit 70 directs current from current source 95 on line 97 to either low current mirror circuit 16 or low current mirror circuit 22 depending on the voltage difference at nodes 101 and 103. When the voltage at node 101 is greater than the voltage at node 103, e.g., when high current mirror circuit 20 is disabled, the voltage at node 101 is approximately equal to high rail voltage 46 while the voltage at node 103 from enabled high current mirror 14 is equal to $V_{ON}-V_{BE}(Q_{P1})-IR_1$. Hence, differential circuit 70 directs current from current source 95 to low current mirror circuit 22. When the voltage at transistor node 101 is less than the voltage at node 103, current is directed from current source 95 to current mirror circuit 16. Resistors 160 ($R_1$) and 162 ($R_2$), e.g., 5 k ohms, may be connected between controlling transistors $Q_{P1}$ and $Q_{P2}$ and nodes 103 and 101, respectively, to increase the voltage differential input to the differential circuit 70 formed by $QP_3$ and $QP_4$.

In operation, when $V_{IN}$ on line 26 is greater than $V_{REF}$ on line 28, differential circuits 62 and 70 enable high current mirror circuit 14 referenced to high rail voltage 46 and low current mirror circuit 22 referenced to low rail voltage 60, while high current mirror circuit 20 referenced to high rail voltage 46 and low current mirror circuit 16 referenced to low rail voltage 60 are disabled. Because low current mirror circuit 16 is disabled, controlled transistor $Q_{NSW}$ will have zero current. At the same time, current is being supplied to base 130 of controlled transistor $Q_{PSW}$ of enabled high current mirror circuit 14. Because collector 120 of controlled transistor $Q_{NSW}$ of low current mirror 16 has zero current and is connected to collector 134 of controlled transistor $Q_{PSW}$, charge builds up at the base 130 of transistor $Q_{PSW}$ causing controlled transistor $Q_{PSW}$ to saturate. When $Q_{PSW}$ saturates, the collector to emitter voltage, $V_{CE}$, of transistor $Q_{PSW}$ is small, usually about 0.1 to 0.2 volts, which effectively sets the voltage at $V_{OUT}$ on line 44 to high rail voltage 46 ($V_{ON}$).

Similarly, because high current mirror circuit 20 is disabled and low current mirror circuit 22 is enabled, controlled transistor $Q_{PSWB}$ of high current mirror 20 has zero current and controlled transistor $Q_{NSWB}$ of low current mirror 22 has current supplied to base 140. Because collector 142 of controlled transistor $Q_{NSWB}$ is connected to controlled transistor $Q_{PSWB}$ with zero current, charge builds up at the base 140 causing transistor $Q_{NSWB}$ to saturate. Thus, the voltage $V_{CE}$ of transistor $Q_{NSWB}$ is small, usually about 0.1 to 0.2 volts, which sets the voltage at $V_{OUT2}$ on line 56 proximate to low rail voltage 60 ($V_{OFF}$).

Similarly, as described above, when $V_{IN}$ is less than $V_{REF}$, differential circuit 62 directs current from current source 82 to high current mirror circuit 20 and current from current source 95 to low current mirror 16. This causes controlled transistor $Q_{PSWB}$ of high current mirror circuit 20 to saturate and set $V_{OUT2}$ on line 56 proximate to high rail voltage 46 ($V_{ON}$) and causes controlled transistor $Q_{NSW}$ of low current mirror circuit 16 to saturate and set $V_{OUT1}$ on line 44 proximate to low rail voltage 60 ($V_{OFF}$).

Because JFET select switch 10 of this invention does not rely on turning on and off JFET switches as in the prior art, the problems associated with quiescent current are eliminated. Moreover, because the select switch 10 of this invention utilizes a relatively small number of devices and does not rely on large resistors, capacitors, and the like, switch 10 is simpler in design and utilizes less power and less die space.

Current supply circuit 30, FIG. 1 may include at least two current sources, such as current source 82, FIG. 2, which may include N-type transistors $Q_{N5}$ and $Q_{N6}$ connected to $V_{EE}$ and current source 95, which may include P-type transistors $Q_{P7}$ and $Q_{P8}$ connected to $V_{DD}$ for supplying current to high current mirror circuits 14 and 20 referenced to high rail voltage 46 and low current mirror circuit 16 and 22 referenced to low rail voltage 60, as described above. JFET select circuit 10 may also include a third current source 180, which may include P-type transistors $Q_{P5}$ and $Q_{P6}$ connected to $V_{DD}$ and high rail voltage 46 on line 194. Current source 180 supplies current to high current mirror circuits 14 and 20 and reduces the current drawn from high rail voltage supply 46 by current source 82. Ideally, current source 180 is matched to current supply 82 to minimize the current drawn from high rail voltage supply 46. JFET select circuit 10 may also include a fourth current source 182 which includes transistors $Q_{N7}$ and $Q_{N8}$, e.g., N-type transistors, connected to $V_{EE}$ and low rail voltage 60 to reduce the current drawn by current source 95. Ideally, current source 182 is matched to current source 95 to minimize the current sourced to the low rail voltage supply 60.

By disconnecting and separating current sources 180 and 95 and connecting current source 95 to differential pair $Q_{P3}$ and $Q_{P4}$ of differential circuit 70 and connecting current source 180 to high rail voltage 46, differential circuit 70 forms a differential pair whose current is accurately controlled by current source 95. Hence, the current sourced or sunk through high rail voltage 46 ($V_{ON}$) and low rail voltage 60 ($V_{OFF}$) is very small, e.g., of the order of microamperes.

Although as shown above, current sources 82 and 182 may include N-type transistors and current sources 95 and 180 may include P-type transistors, this is not a necessary limitation of this invention, as any type of current source may be used for current sources 82, 182, 95, and 180, as known to those skilled in the art.

Figure 3:
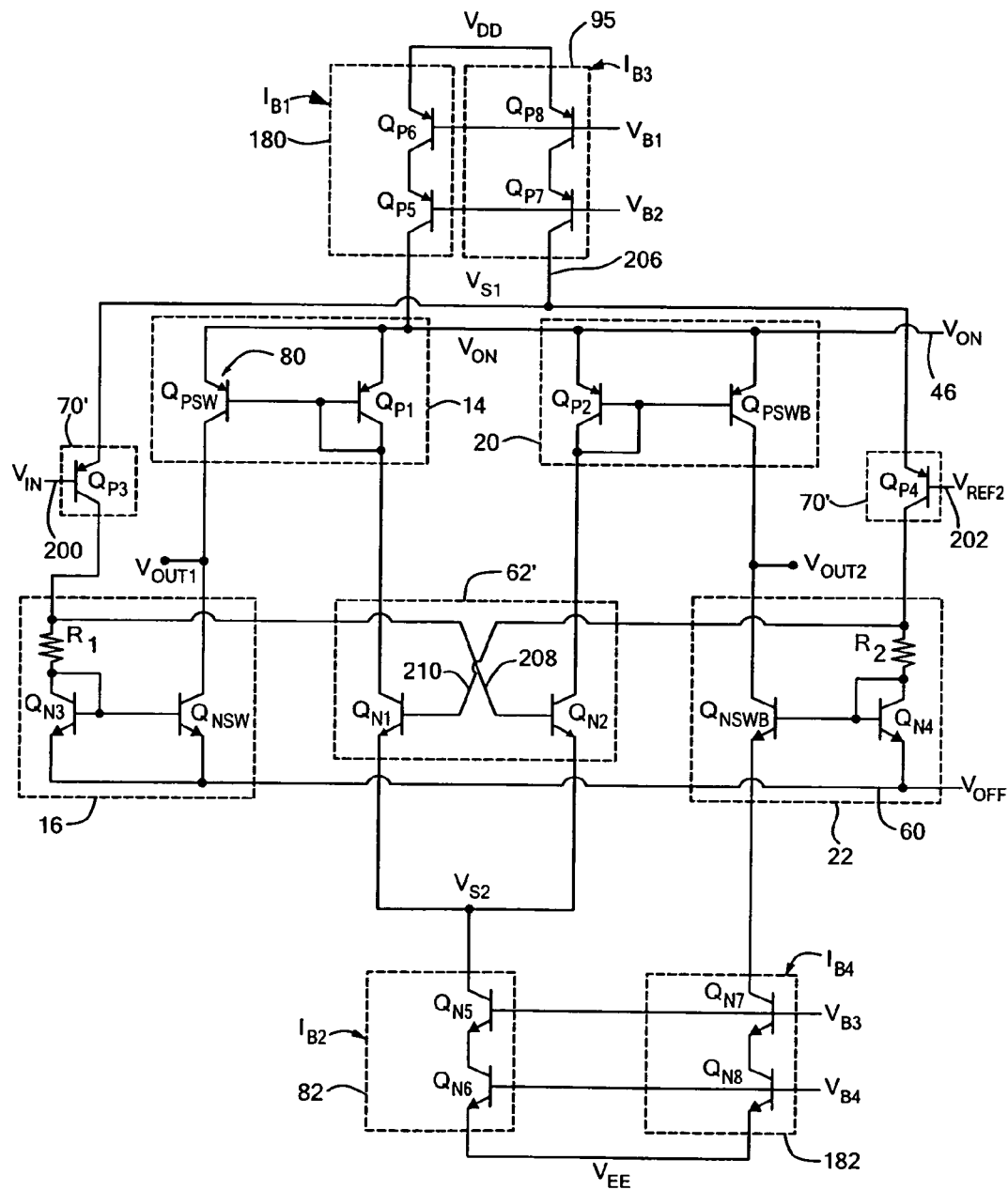
FIG. 3 is a schematic diagram of another embodiment of the JFET switch select circuit shown in FIG. 1.

As shown in FIG. 2, JFET switch select circuit 10 is an N-type select switch this is not a necessary limitation of this invention, as JFET select circuit 10', FIG. 3, where like parts have been given like numbers, may be configured as a P-type switch select circuit. In this design, input voltage $V_{IN}$ is applied to transistor $Q_{P3}$ of differential circuit 70' on line 200 and a reference voltage $V_{REF2}$ is applied to transistor $Q_{P4}$ of differential circuit 70' on line 202. In this example, when $V_{IN}$ is greater than $V_{REF2}$ current is directed from current source 95 on line 206 to enable low current mirror circuit 22 referenced to low rail voltage 60 while low current mirror circuit 16 referenced to low rail voltage 60 is disabled. The output of the differential circuit 70' is connected to differential circuit 62' on lines 208 and 210, respectively, which directs current from current source 82 to high current mirror circuit 14. Similarly as described above, when $V_{IN}$ is greater than $V_{REF2}$ controlled transistor $Q_{NSWB}$ of current mirror circuit 22 and controlled transistor $Q_{PSW}$ of high current mirror circuit 14 saturate and set $V_{OUT1}$ proximate to high rail voltage 46 ($V_{ON}$) and set $V_{OUT2}$ proximate to low rail voltage 60 ($V_{OFF}$). Similarly, when $V_{IN}$ is less than $V_{REF2}$, controlled transistor $Q_{PSWB}$ of high current mirror 20 and controlled transistor $Q_{NSW}$ of low rail current mirror 16 saturate to set $V_{OUT1}$ proximate to low rail voltage 60 and set $V_{OUT2}$ proximate to high rail voltage 46 ($V_{ON}$).

Figure 4:
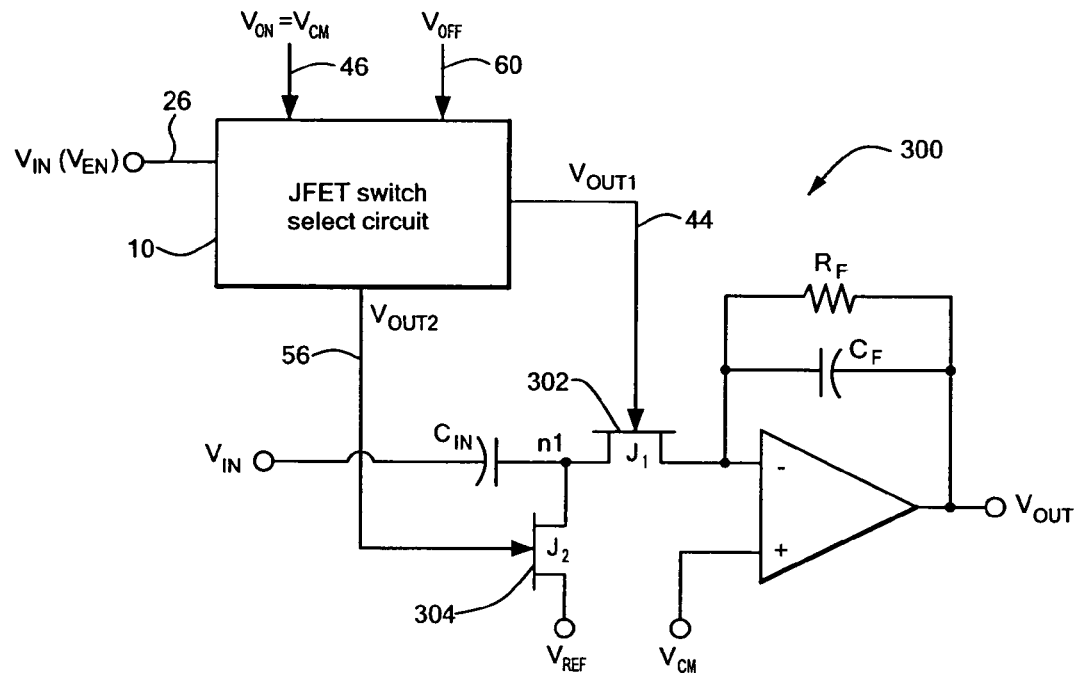
FIG. 4 is a schematic block diagram showing the JFET switch select circuit of this invention employed with a programmable gain amplifier.

JFET switch select circuit 10, FIG. 4 may be employed with a programmable amplifier, such as programmable gain amplifier 300. In this design, the outputs of JFET switch select circuit 10 as described above, e.g., $V_{OUT1}$ on line 44 and $V_{OUT2}$ on line 56, are applied to JFETs 302 and 304, respectively, to selectively and efficiently switch JFETs 302 and 304 on and off.

Figure 5:
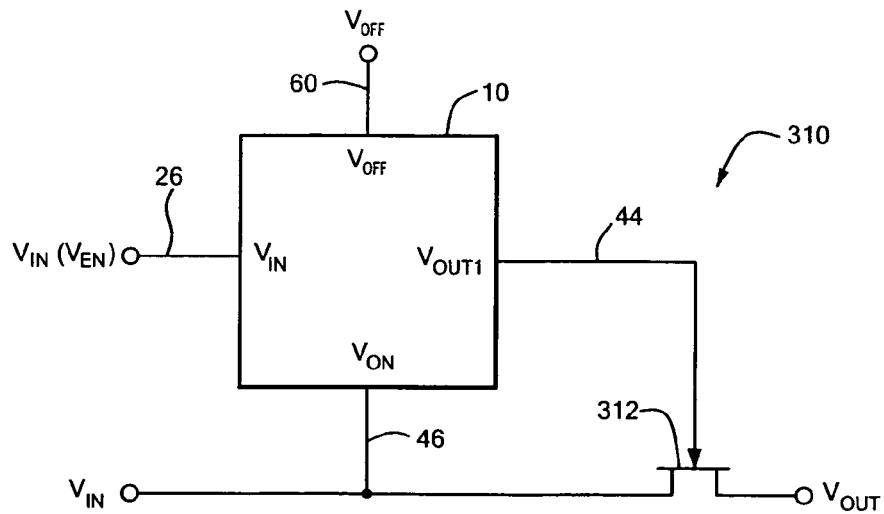
FIG. 5 is a schematic block diagram showing the JFET switch select circuit of this invention employed with an analog switch.

JFET switch select circuit 10, FIG. 5, where like parts have been given like numbers, may also be used with analog switch circuit 310. In this design $V_{ON}$ on line 46 and $V_{OUT1}$ on line 44 are used to selectively control JFET 312 of analog switch 310 to selectively turn JFET 312 on and off.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

Other embodiments will occur to those skilled in the art and are within the following claims.

What is claimed is:

1. A JFET switch select circuit comprising:
 a first current mirror system including a first high current mirror circuit referenced to a high rail voltage and a first low current mirror circuit referenced to a low rail voltage;
 a second current mirror system including a second high current mirror circuit referenced to said high rail voltage and a second low current mirror circuit referenced to said low rail voltage; and
 a comparator circuit responsive to an input voltage and a reference voltage for directing current from a current supply circuit to one of said first and second high current mirror circuits and one of said first and second low current mirror circuits for saturating a switching device of one of said first and second high current mirror circuits to set a first output voltage proximate to a high rail voltage and for saturating a switching device of one of said first and second low current mirror circuits to set a second output voltage proximate a low rail voltage.

2. The JFET switch select circuit of claim 1 in which said first high current mirror circuit and said first low current mirror circuit each includes a controlling and controlled transistor.

3. The JFET switch select circuit of claim 2 in which said controlled transistor of said first high current mirror circuit is saturated when said input voltage is greater than said reference voltage by providing current to said controlled transistor of said first high current mirror circuit while no current is supplied said controlled transistor of said first low current mirror circuit.

4. The JFET switch select circuit of claim 2 in which said controlled transistor of said first low current mirror circuit is saturated when said input voltage is less than said reference voltage by providing current to said controlled transistor of said first low current mirror circuit while no current is supplied to said controlled transistor of said first high current mirror circuit.

5. The JFET switch select circuit of claim 1 in which said second high current mirror circuit and said second low current mirror circuit each includes a controlling and controlled transistor.

6. The JFET switch select circuit of claim 5 in which said controlled transistor of said second low current mirror circuit is saturated when said input voltage is greater than said reference voltage by providing current to said controlled transistor of said second low current mirror circuit while no current is supplied to said controlled transistor of said second high current mirror circuit.

7. The JFET switch select circuit of claim 5 in which said controlled transistor of said second high current mirror circuit is saturated when said input voltage is less than said reference voltage by providing current to said controlled transistor of said second high current mirror circuit while no current is supplied to said controlled transistor of said second low current mirror circuit.

8. The JFET switch select circuit of claim 1 in which said comparator circuit includes a first differential circuit for directing said current from said current circuit to one of said first and second said high current mirror circuits.

9. The JFET switch select circuit of claim 8 in which said first differential circuit includes a first differential pair of transistors.

10. The JFET switch select circuit of claim 8 in said comparator circuit further includes a second differential circuit responsive to said first differential circuit for directing said current from said current circuit to one of said first and second low current mirror circuits.

11. The JFET switch select circuit of claim 10 in which said second differential circuit includes a second differential pair of transistors.

12. The JFET switch select circuit of claim 11 in which said first differential pair of transistors is of opposite polarity to said second differential pair of transistors.

13. The JFET switch select circuit of claim 8 further including a resistor interconnected between the inputs of each of said first and second high current mirror circuits and said first differential circuit for setting a predetermined voltage differential at said second differential circuit.

14. The JFET switch select circuit of claim 10 in which said current circuit includes first and second current sources, said first current source supplying current to one of said first and second high current mirror circuits and said second current source supplying current to one of said first and second low current mirror circuits.

15. The JFET switch select circuit of claim 14 in which said current circuit further includes a third current source interconnected to said high rail voltage power supply and matched to said first current source for supplying current to said first and second high current mirror circuits to reduce the current sourced or sunk from said high rail voltage supply by said first current source.

16. The JFET switch select circuit of claim 15 in which said current circuit further includes a fourth current supply connected to a low rail voltage power supply and matched to said second current source for supplying to said first and second low current mirror circuits to reduce the current sourced to said low rail voltage power supply by said second current source.

17. The JFET switch select circuit of claim 1 in which said first and second output voltages enable gates of first and second junction field effect transistors of a programmable gain amplifier to selectively switch said junction field effect transistors on and off.

18. The JFET switch select circuit of claim 1 in which said first and second output voltages enable a gate of a junction field effect transistors of an analog switch circuit to selectively switch said gate on and off.

19. The JFET switch select circuit of claim 10 further including a resistor interconnected between the outputs of each of said first and second low current mirror circuits and said second differential circuit for setting a predetermined voltage at said first differential circuit.

20. The JFET switch select circuit of claim 19 in which said input voltage and said reference voltage are applied to said second differential circuit for directing said current from said current supply circuit to said one of first and second low current mirror circuits for saturating said switching device of one of said first and second high current mirror circuits to set a first output voltage proximate to a high rail voltage and for saturating a transistor of one of said first and second low current mirror circuits to set a second output voltage proximate to a low rail voltage.

21. A JFET switch select circuit comprising:
a first current mirror system including a first high current mirror circuit referenced to a high rail voltage and a first low current mirror circuit referenced to a low rail voltage;
a second current mirror system including a second high current mirror circuit referenced to said high rail voltage and a second low current mirror circuit referenced to said low rail voltage;
a comparator circuit responsive to an input voltage and a reference voltage for directing current from a current circuit to one of said first and second high current mirror circuits and one of said first and second low current mirror circuits for saturating a switching device of one of said first and second high current mirror circuits to set a first output voltage proximate to said high rail voltage and for saturating a switching device of one of said first and second low current mirror circuits to set a second voltage output proximate to said low rail voltage; and
a programmable gain amplifier including first and second junction field effect transistors responsive to said first and second output voltages that selectively switch said first and second junction field effect transistors on and off.

22. A JFET switch select circuit comprising:
a first current mirror system including a first high current mirror circuit referenced to a high rail voltage and a first low current mirror circuit referenced to a low rail voltage;
a second current mirror system including a second high current mirror circuit referenced to said high rail voltage and a second low current mirror circuit referenced to said low rail voltage;
a comparator circuit responsive to an input voltage and a reference voltage for directing current from a current circuit to one of said first and second high current mirror circuits and one of said first and second low current mirror circuits for saturating a switching device of one of said first and second high current mirror circuits to set a first output voltage proximate to said high rail voltage and for saturating a switching device of one of said first and second low current mirror circuits to set a second voltage output proximate to said low rail voltage; and an analog switch circuit including at least one gate response to said first voltage and said high rail voltage that selectively switch said field effect transistor on and off.

23. A JFET switch select circuit comprising:
a first current mirror system including a first high current mirror circuit referenced to a high rail voltage and a first low current mirror circuit referenced to a low rail voltage each having a controlling and controlled transistor;
a second current mirror system including a second high current mirror circuit referenced to said high rail voltage and a second low current mirror circuit referenced to said low rail voltage each having a controlling and controlled transistor; and
a comparator circuit responsive to an input voltage and a reference voltage for directing current from a current supply circuit to one of said first and second high current mirror circuits and one of said first and second low current mirror circuits for saturating said controlled transistor of one of said first and second high current mirror circuits to set a first output voltage proximate to a high rail voltage and for saturating said controlled transistor of one of said first and second low current mirror circuits to set a second output voltage proximate a low rail voltage.

24. A JFET switch select circuit comprising:
a first current mirror system including a first high current mirror circuit referenced to a high rail voltage and a first low current mirror circuit referenced to a low rail voltage each having a controlling and controlled transistor;
a second current mirror system including a second high current mirror circuit referenced to said high rail voltage and a second low current mirror circuit referenced to said low rail voltage each having a controlling and controlled transistor; and
a comparator circuit responsive to an input voltage and a reference voltage for directing current from a current supply circuit to said controlling transistor of said first high current mirror circuit and said controlling transistor of said second low current mirror circuit for saturating said controlled transistor of said first high current mirror circuit to set a first output voltage proximate to a high rail voltage and for saturating said controlled transistor of said second low current mirror circuit to set a second output voltage proximate a low rail voltage.

25. The JFET switch select circuit of claim 24 in which said input voltage is less than said reference voltage.

26. The JFET switch select circuit of claim 24 in which said comparator circuit is responsive to said input reference voltage being greater than said input voltage and directs current from a current supply circuit to said controlling transistors of said second high current mirror circuit and said controlling transistor of said first low current mirror circuit for saturating said controlled transistor of one of said second high current mirror circuit to set a second output voltage proximate to a high rail voltage and for saturating said controlled transistor of said first low current mirror circuit to set a first output voltage proximate a low rail voltage.

27. An N-type JFET switch select circuit comprising:
a first current mirror system including a first high current mirror circuit referenced to a high rail voltage and a first low current mirror circuit referenced to a low rail voltage;

a second current mirror system including a second high current mirror circuit referenced to said high rail voltage and a second low current mirror circuit referenced to said low rail voltage; and a comparator circuit responsive to an input voltage and a reference voltage for directing current from a current supply circuit to one of said first and second high current mirror circuits and one of said first and second low current mirror circuits for saturating a switching device of one of said first and second high current mirror circuits to set a first output voltage proximate to a high rail voltage and for saturating a switching device of one of said first and second low current mirror circuits to set a second output voltage proximate a low rail voltage.

28. A P-type JFET switch select circuit comprising:

a first current mirror system including a first high current mirror circuit referenced to a high rail voltage and a first low current mirror circuit referenced to a low rail voltage;

a second current mirror system including a second high current mirror circuit referenced to said high rail voltage and a second low current mirror circuit referenced to said low rail voltage; and a comparator circuit responsive to an input voltage and a reference voltage for directing current from a current supply circuit to one of said first and second high current mirror circuits and one of said first and second low current mirror circuits for saturating a switching device of one of said first and second high current mirror circuits to set a first output voltage proximate to a high rail voltage and for saturating a switching device of one of said first and second low current mirror circuits to set a second output voltage proximate a low rail voltage.

* * * * *